United States Patent
Oku et al.

[19]

[11] Patent Number: 5,812,364
[45] Date of Patent: Sep. 22, 1998

[54] CAPACITOR

[75] Inventors: Tomoki Oku; Takahide Ishikawa, both of Tokyo, Japan

[73] Assignee: Mitsubishi Denki Kabushiki Kaisha, Tokyo, Japan

[21] Appl. No.: 782,671

[22] Filed: Jan. 15, 1997

[30] Foreign Application Priority Data

Jul. 3, 1996 [JP] Japan ..................................... 8-174013

[51] Int. Cl.⁶ .............................. H01G 4/06; H01G 4/20; H01G 4/12
[52] U.S. Cl. ...................... 361/312; 361/313; 361/321.5; 257/306; 438/396
[58] Field of Search ................................ 361/302, 306.3, 361/308.3, 312, 313, 321.2, 321.3, 321.4, 321.5, 322; 257/303, 306, 532, 763; 438/239, 243, 244, 254, 253, 396, 397, 399

[56] References Cited

U.S. PATENT DOCUMENTS

| | | | |
|---|---|---|---|
| 4,635,400 | 1/1987 | Brown et al. | 361/304 |
| 5,142,639 | 8/1992 | Kohyama et al. | 257/306 |
| 5,349,494 | 9/1994 | Ando | 361/322 |
| 5,406,447 | 4/1995 | Miyazaki | 361/313 |
| 5,706,064 | 1/1998 | Fukunaga et al. | 349/43 |
| 5,731,216 | 3/1998 | Holmberg et al. | 437/40 |
| 5,742,472 | 4/1998 | Lee et al. | 361/321.4 |

FOREIGN PATENT DOCUMENTS 5299581  11/1993  Japan .
7326712  12/1995  Japan .

OTHER PUBLICATIONS

Oku et al., "Influence of Current Injection Into a-SiN:H Films on Charge Trapping Defects", Materials Research Society Symposium Proceedings, vol. 209, 1991, pp. 487–492.

*Primary Examiner*—Bot L. Ledynh
*Assistant Examiner*—Anthony Dinkins
*Attorney, Agent, or Firm*—Leydig, Voit & Mayer

[57] ABSTRACT

An MIM capacitor includes a lower electrode; a first insulating film disposed on the lower electrode; a second insulating film disposed on the first insulating film and having a first opening exposing a portion of the surface of the first insulating film on the lower electrode, the first opening having a perimeter; a third insulating film disposed on the second insulating film and having a second opening exposing a portion of the surface of the second insulating film, the second opening having a perimeter that surrounds the perimeter of the first opening on the second insulating film; and an upper electrode disposed on the first insulating film through the first opening and extending onto the second insulating film.

8 Claims, 10 Drawing Sheets

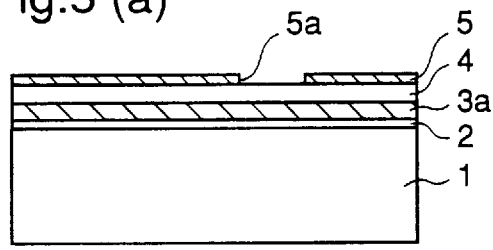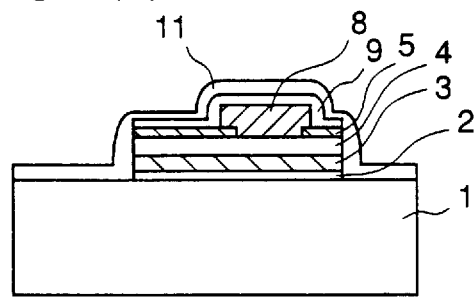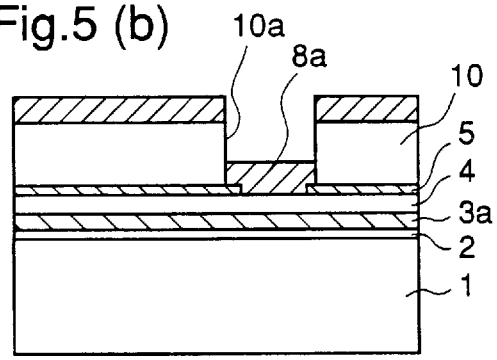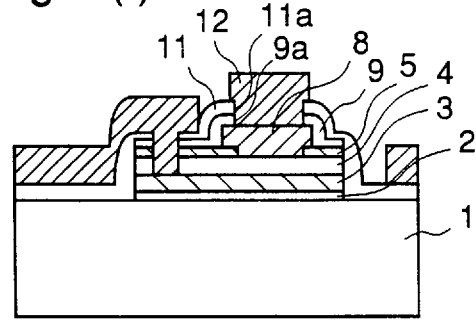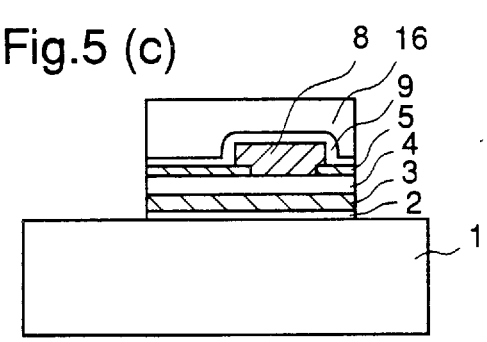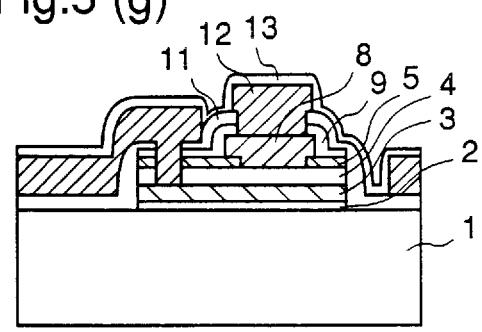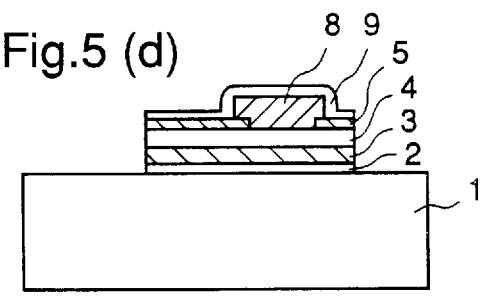

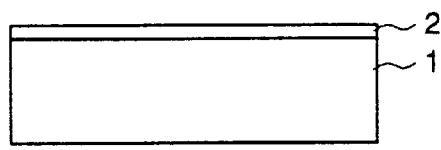
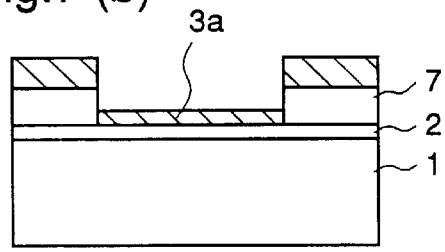
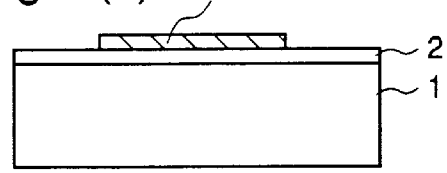
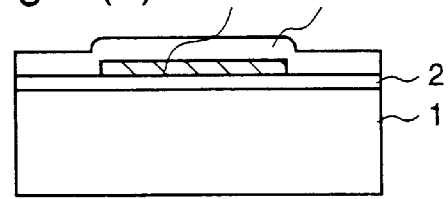
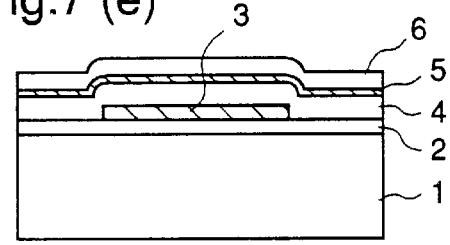
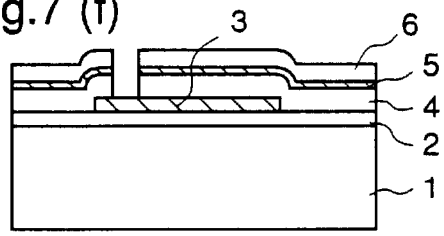
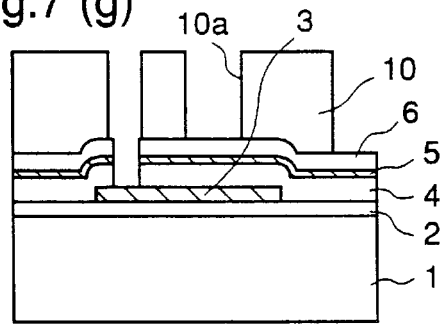
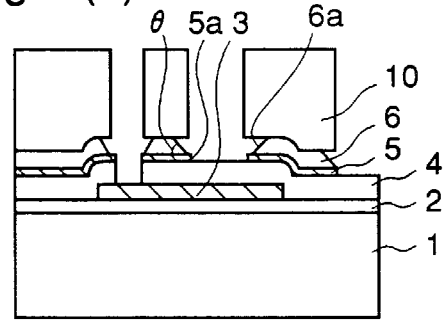
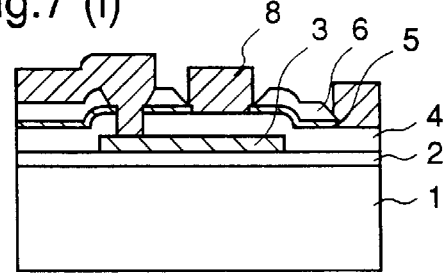
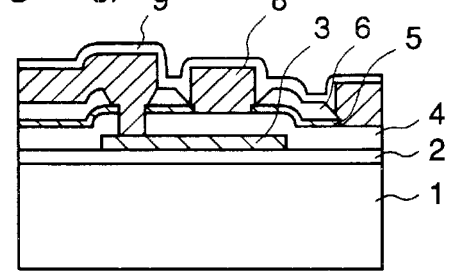

CAPACITOR

FIELD OF THE INVENTION

The present invention relates to structures of a capacitor and a semiconductor device included in a compound semiconductor monolithic IC, and methods for fabricating the capacitor and the semiconductor device.

BACKGROUND OF THE INVENTION

Compound semiconductor monolithic ICs, such as GaAs MMICs (Monolithic Microwave Integrated Circuits), are devices that effectively utilize the excellent electron transport characteristics of compound semiconductor materials to realize high-speed FETs (Field Effect Transistors). Hence, application of such MMICs to microwave or millimeter wave ICs for satellites has been promoted, and demand for MMICs has increased with development of movable radio apparatus in recent years. However, since MMICs used for satellites are subjected to severe circumstances for a long time, very high reliability is required of the MMICs.

A typical GaAs MMIC comprises active and passive elements, such as FETs, resistors, MIM (Metal Insulator Metal) capacitors, spiral inductors, and wiring layers for connecting these elements. Among these elements, MIM capacitors are key parts that determine the product lifetime of the GaAs MMIC, and various methods are used to maintain the lifetime of the MIM capacitors. A well-known method for this purpose is to lead a wiring from an upper electrode of an MIM capacitor using an air-bridge so that the wiring does not directly contact a dielectric body in the MIM capacitor.

An SiN film or an SiON film produced by plasma CVD is used as a dielectric body in an MIM capacitor. The reason is as follows. That is, in a GaAs or InP MMIC, it is difficult to use an $SiO_2$ film as an insulating film because the compound semiconductor is easily oxidized and a sufficient thickness thereof is not obtained. Usually, a method of fabricating an MIM capacitor in a GaAs MMIC comprises forming a lower electrode by vacuum evaporation and lift-off, depositing an SiN or SiON film on the lower electrode by plasma CVD, and forming an upper electrode on the insulating film by vacuum evaporation and lift-off.

The above-mentioned vacuum evaporation and lift-off technique will be described using FIG. 10. Initially, a resist is patterned in a desired shape on a compound semiconductor substrate 20 by conventional photolithography to form a mask pattern 21, and a metal film 22 is deposited over the entire surface. Thereafter, the resist mask 21 and unnecessary portions of the metal film 22 on the resist mask 21 are removed, leaving a portion of the metal film 22 as an electrode.

However, the evaporation and lift-off technique has a risk that the surface of the metal film constituting an electrode can be damaged. This damage is caused because the metal film subjected to the lift-off process rubs the surface of the wafer when it is removed. As a result, the dielectric breakdown voltage and the reliability of the MIM capacitor are significantly reduced. In order to avoid such damage at the surface of the metal film, in place of the vacuum evaporation and lift-off technique, a method of depositing a wiring layer by sputtering and patterning the wiring layer by ion milling (hereinafter referred to as a sputtering and ion milling method) has been employed in recent years.

The sputtering and ion milling method will be described using FIG. 11. Initially, a metal film 22 is formed on a compound semiconductor substrate 20 by sputtering, and a resist is patterned into a desired shape on the metal film 22 by conventional photolithography to form a mask pattern 23. Thereafter, using the mask pattern 23, the metal film 22 is patterned by ion milling to form an electrode.

FIG. 12 is a cross-sectional view illustrating an MIM capacitor fabricated by the method shown in FIG. 11. In FIG. 12, reference numeral 1 designates a semiconductor substrate. An insulating film 2 is disposed on the semiconductor substrate 1. A lower electrode 3 is disposed on the insulating film 2. A dielectric film 4 is disposed on the lower electrode 3 and on the insulating film 2. For example, a 1000~2000 Å thick SiN film is employed as the dielectric film 4. An upper electrode 8 is disposed on the dielectric film 4. For example, a 1~2 μm thick Au film is employed as the upper electrode 8. An insulating film 9 covers the upper electrode 8 and has an opening 9a at the surface of the upper electrode 8. A feeding layer 14 electrically contacts the upper electrode 8 through the opening 9a. An air-bridge 15 is disposed on the feeding layer 14.

In the method shown in FIG. 11, the surface of the metal film constituting the electrode is hardly damaged. However, as shown in FIG. 12, portions of the dielectric film 4 contacting the edge of the upper electrode 8 are unfavorably etched in the ion milling process of forming the upper electrode 8.

More specifically, in the MIM capacitor shown in FIG. 12, when Au is used as a material of the upper electrode 8, the Au film is desired to be as thick as 1~2 μm to reduce conductor loss. Especially when the dielectric film 4 comprises SiN, the ratio of the etching rate of Au to the etching rate of SiN, by ion milling, is about 5:1. So, if the Au electrode 8 is over-etched by 10%, the dielectric film 4 is etched by 200~400 Å. Since the thickness of the dielectric film 4 is 1000~2000 Å, only 600~1800 Å is secured for the thickness of the dielectric film 4 after the ion milling.

FIG. 13 is a graph illustrating a relationship between the lifetime of the MIM capacitor and the thickness of the etched portion of the dielectric film 4 in the vicinity of the upper electrode 8. The thickness of the dielectric film 4 is 2000 Å, and a voltage of 10 V is applied. It is found from FIG. 13 that the lifetime is reduced with an increase in the thickness of the etched portion of the dielectric film 4. Therefore, in order to avoid the reduction in the lifetime, the MIM capacitor must be fabricated using a method excluding etching of the dielectric film 4.

SUMMARY OF THE INVENTION

An object of the present invention is to provide a capacitor without reduced lifetime, and a semiconductor device including the capacitor.

Another object of the present invention is to provide methods for fabricating the capacitor and the semiconductor device.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a capacitor comprises a lower electrode; a first insulating film disposed on the lower electrode; a second insulating film disposed on the first insulating film and having a first opening to expose a portion of the surface of the first insulating film on the lower electrode, the first opening having a circumference; a third insulating film disposed on the second insulating film and having a second opening to expose a portion of the surface of the second insulating film, the second opening having a circumference that surrounds the circumference of the first opening on the second insulating film; and an upper electrode disposed on the first insulating film through the first opening and extending on the second insulating film. Therefore, in the fabrication process of this capacitor, the first insulating film in the vicinity of the upper electrode is not etched, so that unwanted reduction in the lifetime of the device is avoided. In addition, the integration density of the capacitor can be increased.

According to a second aspect of the present invention, a capacitor comprises a lower electrode; a first insulating film disposed on the lower electrode and comprising a silicon nitride film having an etching rate; a second insulating film disposed on the first insulating film and comprising a silicon nitride film having an etching rate higher than the etching rate of the first insulating film, the second insulating film having an opening to expose a portion of the surface of the first insulating film on the lower electrode; and an upper electrode disposed on the first insulating film through the opening of the second insulating film and extending on the second insulating film. Therefore, in the fabrication process of this capacitor, the first insulating film in the vicinity of the upper electrode is not etched, so that unwanted reduction in the lifetime of the device is avoided. In addition, since the etching rate of the first insulating film is different from the etching rate of the second insulating film, the thickness of the first insulating film is uniform between products, so that variations in the capacitances between the products are reduced.

According to a third aspect of the present invention, a method of fabricating a capacitor comprises forming a first insulating film on a lower electrode; forming a second insulating film on the first insulating film; forming a third insulating film on the second insulating film; applying a resist on the third insulating film; patterning the resist by photolithography to form a resist mask having a desired opening; using the resist mask, etching the third insulating film to form a first opening that is wider than the opening of the resist mask and exposes a portion of the surface of the second insulating film on the lower electrode; using the resist mask, etching the second insulating film to form a second opening that is narrower than the first opening and exposes a portion of the surface of the first insulating film; depositing a conductive film on the resist mask and on the first insulating film through the first and second openings by vacuum evaporation; and forming an upper electrode comprising a portion of the conductive film by removing the resist mask. In this method, since the first insulating film in the vicinity of the upper electrode is not etched, unwanted reduction in the lifetime of the device is avoided. In addition, many steps in the fabrication process employ the same resist mask, the number of process steps is reduced. In addition, the integration density of the capacitor is increased.

According to a fourth aspect of the present invention, a method of fabricating a capacitor comprises forming a first conductive film to be a lower electrode; forming a first insulating film on the first conductive film; forming a second insulating film on the first insulating film; forming a third insulating film on the second insulating film; applying a resist on the third insulating film; patterning the resist by photolithography to form a first resist mask having a desired opening; using the first resist mask, etching the third insulating film to form a first opening that is wider than the opening of the first resist mask and exposes a portion of the surface of the second insulating film; using the first resist mask, etching the second insulating film to form a second opening that is narrower than the first opening and exposes a portion of the surface of the first insulating film; depositing a second conductive film to be an upper electrode, on the resist mask and on the first insulating film through the first and second openings by vacuum evaporation; forming an upper electrode comprising a portion of the second conductive film by removing the resist mask; forming a fourth insulating film on the upper electrode and on the second and third insulating films; using a resist patterned by photolithography as a second mask, etching the plural insulating films so that the upper electrode is surrounded by the insulating films; using the second mask, removing unnecessary portions of the first conductive film by ion milling to form a lower electrode; etching a portion of the fourth insulating film to form a contact hole that exposes a portion of the surface of the upper electrode; and forming a wiring layer electrically contacting the upper electrode through the contact hole. In this method, since the first insulating film in the vicinity of the upper electrode is not etched, unwanted reduction in the lifetime of the device is avoided. In addition, many steps in the fabrication process employ the same resist mask, the number of process steps is reduced. In addition, the integration density of the capacitor is increased.

According to a fifth aspect of the present invention, a method of fabricating a capacitor comprises forming a first insulating film comprising a silicon nitride film and having an etching rate, on a lower electrode; forming a second insulating film on the first insulating film, the second insulating film comprising a silicon nitride film having an etching rate higher than the etching rate of the first insulating film; etching the second insulating film to form an opening that exposes a portion of the surface of the first insulating film on the lower electrode; and forming an upper electrode on the first insulating film, extending on the second insulating film, through the opening of the second insulating film. In this method, since the first insulating film in the vicinity of the upper electrode is not etched, unwanted reduction in the lifetime of the device is avoided. In addition, since the etching rate of the first insulating film is different from the etching rate of the second insulating film, the thickness of the first insulating film is uniform between products, so that variations in the capacitances between the products are reduced.

According to a sixth aspect of the present invention, a method of fabricating a capacitor comprises forming a conductive film to be a lower electrode; forming a first insulating film comprising a silicon nitride film and having an etching rate, on the conductive film; forming a second insulating film on the first insulating film, the second insulating film comprising a silicon nitride film having an etching rate higher than the etching rate of the first insulating film; etching the second insulating film to form an opening that exposes a portion of the surface of the first insulating film on the conductive film; forming an upper electrode on the first insulating film, extending on the second insulating film, through the opening of the second insulating film; forming a fourth insulating film on the upper electrode and on the second insulating film; using a resist patterned by photolithography as a mask, etching the first to fourth insulating films so that the upper electrode is surrounded by the insulating films; using the mask, removing portions of the conductive film by ion milling to form a lower electrode; etching the fourth insulating film to form a contact hole that exposes a portion of the surface of the upper electrode; and forming a wiring layer electrically contacting the upper electrode through the contact hole. In this method, since the first insulating film in the vicinity of the upper electrode is not etched, unwanted reduction in the lifetime of the device is avoided. In addition, since the etching rate of the first insulating film is different from the etching rate of the second insulating film, the thickness of the first insulating film is uniform between products, so that variations in the capacitances between the products are reduced.

BRIEF DESCRIPTION OF THE DRAWINGS

FIGS. 5(a)–5(g) are cross-sectional views illustrating process steps in a method of fabricating a semiconductor device according to the second embodiment.

FIGS. 7(a)–7(j) are cross-sectional views illustrating process steps in a method of fabricating a semiconductor device according to the third embodiment.

DETAILED DESCRIPTION OF THE PREFERRED EMBODIMENTS

[Embodiment 1]

Figure 1:
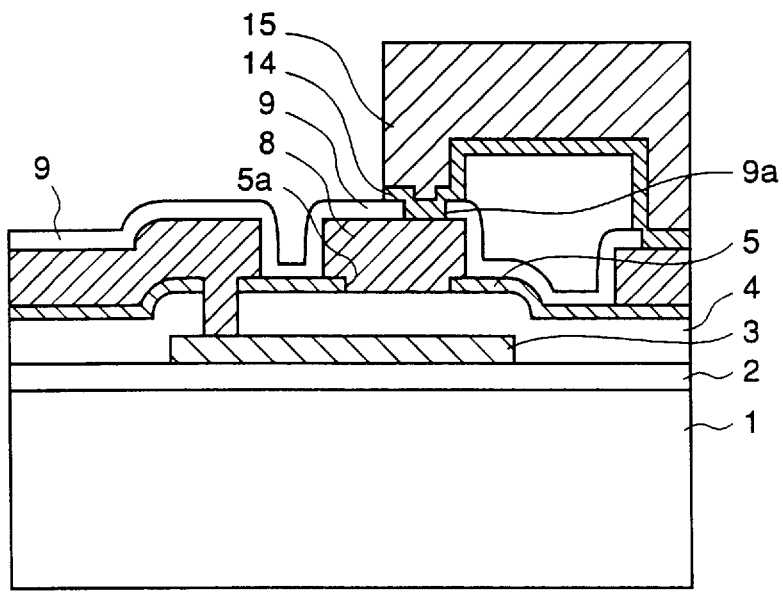
FIG. 1 is a cross-sectional view illustrating a semiconductor device according to a first embodiment of the invention.

FIG. 1 is a cross-sectional view illustrating a semiconductor device according to a first embodiment of the present invention. In FIG. 1, reference numeral 1 designates a compound semiconductor substrate. In this first embodiment, a GaAs substrate is employed. An insulating film 2 is disposed on the substrate 1 to insulate the substrate 1 from elements disposed on the substrate. In this embodiment, a 750 Å thick SiO film is employed. Alternatively, a 500~1000 Å thick SiON or SiN film produced by plasma CVD may be employed.

The elements disposed on the substrate 1 are as follows. A lower electrode 3 is disposed on the insulating film 2. The lower electrode 3 comprises laminated layers of Ti/Mo/Au having a total thickness of 3000 Å and a low sheet resistance. The order of the laminated layers may be changed to Ti/Au/Mo. Alternatively, the lower electrode 3 may comprise laminated metal layers of Ti/Pt having a thickness of several thousands of angstroms and a high heat resistance. A dielectric film 4 (first insulating film) is disposed on the lower electrode 3 and on the insulating film 2. In this embodiment, an SiN film having a thickness of 2000 Å and an Si to N composition ratio of 3/4, i.e., $Si_3N_4$, is employed. Alternatively, a 1000~2000 Å thick SiON or SiN film produced by plasma CVD may be employed.

A second insulating film 5 is disposed on the dielectric film 4. In this embodiment, a 500 Å thick SiN film contains more hydrogen than the dielectric film 4 and has an etching rate in buffered hydrogen fluoride (hereinafter referred to as buffered HF) higher than that of the dielectric film 4. The SiN film 5 is produced by plasma CVD. Alternatively, an SiO film produced by plasma CVD may be employed. The second insulating film 5 has an opening 5a in which a portion of the dielectric film 4, opposed to the lower electrode 3, is exposed.

An upper electrode 8 is disposed on the dielectric film 4 through the opening 5a of the second insulating film 5, and the peripheral portion of the upper electrode 8 extends on the second insulating film 5. The upper electrode 8 comprises a 2 μm thick Au film. Since the upper electrode 8 also serves as a wiring layer, when Au is employed, it must be as thick as 1~2 μm to avoid conductor loss.

The upper electrode 8 is covered with an insulating film 9, whereby the parasitic capacitance is reduced. In this embodiment, a 1000 Å thick SiO film is employed. Alternatively, an SiN film about 5000 Å thick may be employed. In this case, the moisture resistance is improved. Both the insulating films 2 and 9 protect the MIM capacitor in this semiconductor device and other active elements (not shown) in the GaAs MMIC from ashing and etching in the fabricating process. The insulating film 9 has an opening 9a to expose a portion of the upper electrode 8. A feeding layer 14 electrically contacts the upper electrode 8 through the opening 9a. An air-bridge 15 is disposed on the feeding layer 14.

FIGS. 2(a)–2(h) are cross-sectional views illustrating process steps in a method of fabricating the semiconductor device shown in FIG. 1.

Figure 2:
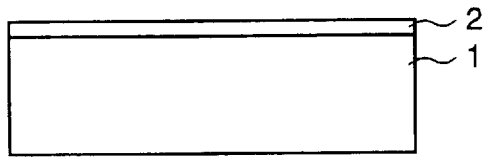
FIGS. 2(a)–2(h) are cross-sectional views illustrating process steps in a method of fabricating a semiconductor device according to the first embodiment.
Figure 2:
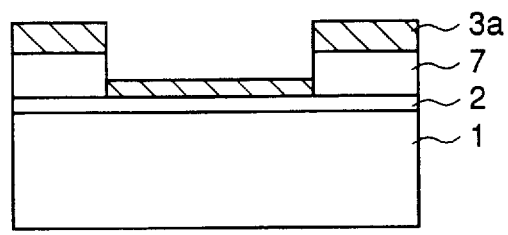
Figure 2:
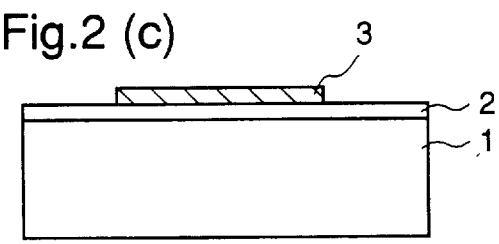
Figure 2:
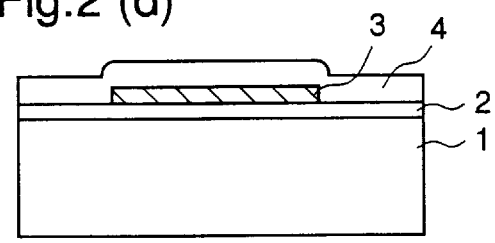
Figure 2:
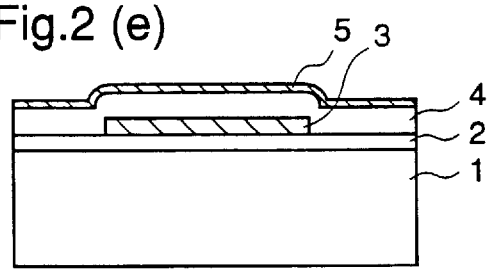
Figure 2:
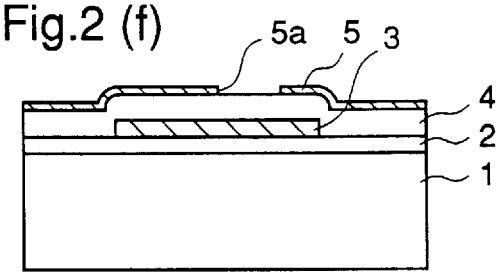
Figure 2:
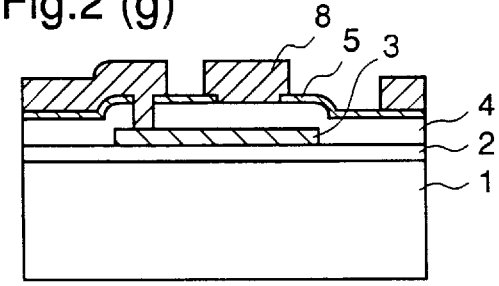
Figure 2:
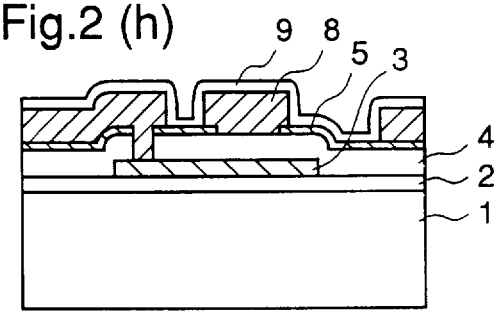

Initially, as illustrated in FIG. 2(a), the insulating film 2 is formed on the compound semiconductor substrate 1. Preferably, a 500~1000 Å thick SiO, SiON, or SiN film is deposited on the substrate 1 by plasma CVD. In this first embodiment, a 750 Å thick SiO film is employed.

In the step of FIG. 2(b), a resist mask 7 having a desired opening is formed on the surface of the insulating film 2 by conventional photolithographic technique. Then, a metal film 3a is deposited over the entire surface by vacuum evaporation. Preferably, a Ti/Pt film having a high heat resistance or a Ti/Mo/Au (Ti/Au/Mo) film having a low sheet resistance is deposited to a thickness of several thousand of angstroms. In this embodiment, a 3000 Å thick Ti/Mo/Au film is deposited. Thereafter, resist mask 7 and unnecessary portions of the metal film 3a on the resist mask 7 are removed by the lift-off technique, leaving the lower electrode 3 on the insulating film 2 as shown in FIG. 2(c). Although the lower electrode 3 is produced by the vacuum evaporation and lift-off method, it may be produced by wire sputtering.

In the step of FIG. 2(d), the dielectric film 4 is deposited on the lower electrode 3 by plasma CVD. Preferably, a 1000~2000 Å thick SiON or SiN film is deposited. In this embodiment, a 2000 Å thick SiN film is deposited while controlling the flow rate of $SiH_4$ and the flow rate of $NH_3$ so that the composition ratio of Si/N is 3/4.

In the step of FIG. 2(e), the second insulating film 5 is deposited on the dielectric film 4 by plasma CVD. As described above, a 500 Å thick SiN film containing more hydrogen than the dielectric film 4 and having a high etching rate by buffered HF is employed.

To be specific, this SiN film 5 is produced by changing the CVD conditions from the CVD conditions for the $Si_3N_4$ dielectric film 4. That is, the CVD temperature is reduced, the gas pressure is increased, and the RF power is reduced. More specifically, the CVD temperature is reduced from 300° C. to 250° C., the gas pressure is increased from 0.5 Torr to 2.0 Torr, and the RF power is reduced from 200 W to 100 W. Thereby, the etching rate of the SiN film 5 by buffered HF is increased from 80 Å/min to 1000 Å/min. Further, the SiN film 5 produced under the above-mentioned conditions contains more hydrogen than the $Si_3N_4$ dielectric film 4. The buffered HF is $HF/NH_4F$ (=1/30).

Next, as illustrated in FIG. 2(f), using the buffered HF, a portion of the second insulating film 5 is etched selectively with respect to the dielectric film 4, producing the opening 5a in the second insulating film 5. Since the ratio of the etching rate of the second insulating film 5 to the etching rate of the dielectric film 4 is about 12:1, selective etching of the second insulating film 5 is possible.

In the step of FIG. 2(g), the upper electrode 8 comprising 2 µm thick Au is produced on the dielectric film so that the peripheral portion of the upper electrode 8 extends on the second insulating film 5. The upper electrode 8 is produced by the wire sputtering and ion milling method or the vacuum evaporation and lift-off method.

Since the upper electrode 8 also serves as a wiring layer, when Au is employed, the upper electrode 8 must be as thick as 1~2 µm to assure conductor continuity. Therefore, when the second insulating film 5 comprises SiN as described above, since the ratio of the etching rate of the Au film to the etching rate of the SiN film by ion milling is about 5:1, only 10% over-etching of the Au film results in etching of the second insulating film 5 in the vicinity of the upper electrode 8 by 200~400 Å. So, leaving a margin, the thickness of the second insulating film 5 is 500 Å in this first embodiment.

In the step of FIG. 2(h), the SiO film 9 about 1000 Å thick is deposited over the entire surface. Thereafter, a contact hole 9a is produced in the SiO film 9 to expose a portion of the upper electrode 8, and the feeding layer 14 is produced, contacting the upper electrode 8 through the contact hole 9a. Finally, the air-bridge 15 is formed on the feeding layer 14 to complete the semiconductor device shown in FIG. 1.

In the semiconductor device so produced, since the etching rate of the second insulating film 5 is higher than the etching rate of the dielectric film 4, the thickness of the dielectric film 4 after the etching to produce the opening 5a can be uniform between products, so that variations in the capacitances between the products are reduced.

Figure 13:
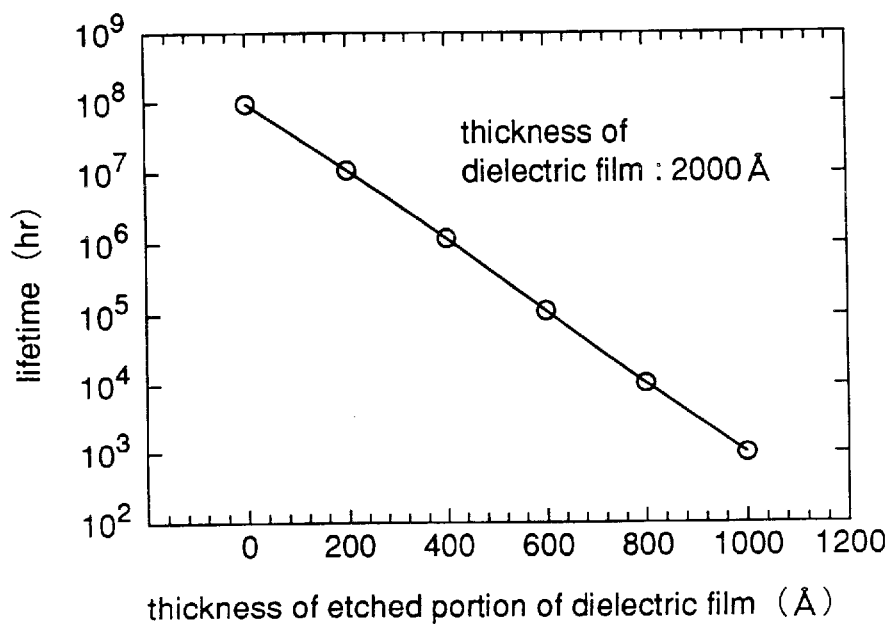
FIG. 13 is a graph illustrating the relationship between the lifetime of the MIM capacitor and the thickness of an etched portion of a dielectric film.

Further, since the upper electrode 8 extends from the surface of the dielectric film 4 onto the second insulating film 5 through the opening 5a, when the upper electrode 8 is produced, the dielectric film 4 in the vicinity of the upper electrode 8 is not etched, so that an unwanted reduction in the lifetime of the device is avoided. That is, in FIG. 13, since the thickness of the etched portion of the dielectric film 4 is zero, a reduction in lifetime is avoided. Further, since the second insulating film 5 prevents the surface of the upper electrode 8 and its vicinity from being damaged, the reduction in the lifetime is avoided.

Furthermore, although a composition ratio of SiN dielectric film 4 is different from the composition ratio of the SiN insulating film 5, since both of the films 4 and 5 comprise SiN, these films can be produced in the same apparatus using the same gases but changing the growth conditions. Therefore, the semiconductor device is produced economically, with high efficiency.

Figure 3:
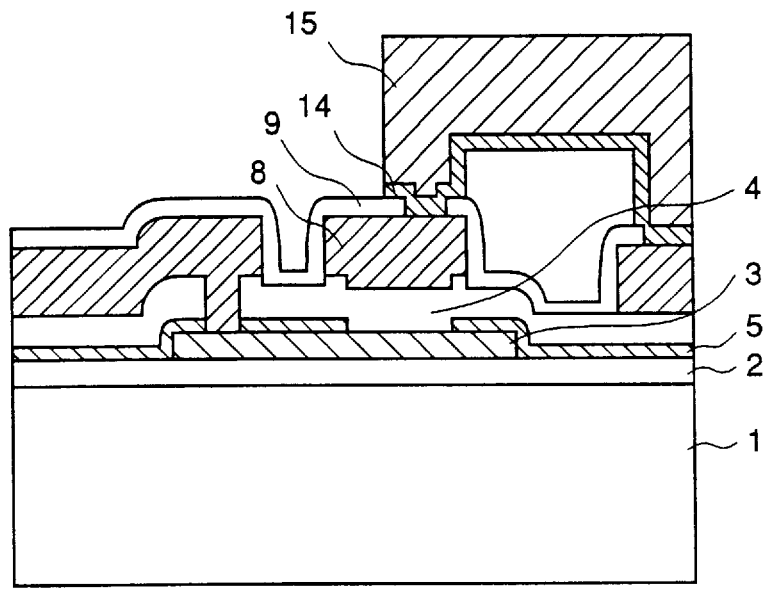
FIG. 3 is a cross-sectional view illustrating a semiconductor device according to a modification of the first embodiment.

FIG. 3 is a cross-sectional view illustrating a semiconductor device according to a modification of the first embodiment. In FIG. 3, a second insulating film 5 having an opening 5a is disposed on the lower electrode 3, and a dielectric film 4 is disposed on the second insulating film 5, contacting the lower electrode 3 through the opening 5a. Further, the upper electrode 8 is disposed on the dielectric film 4 so that the peripheral portion is placed on the dielectric film 4. Also in this case, the lifetime of the device is increased.

[Embodiment 2]

Figure 4:
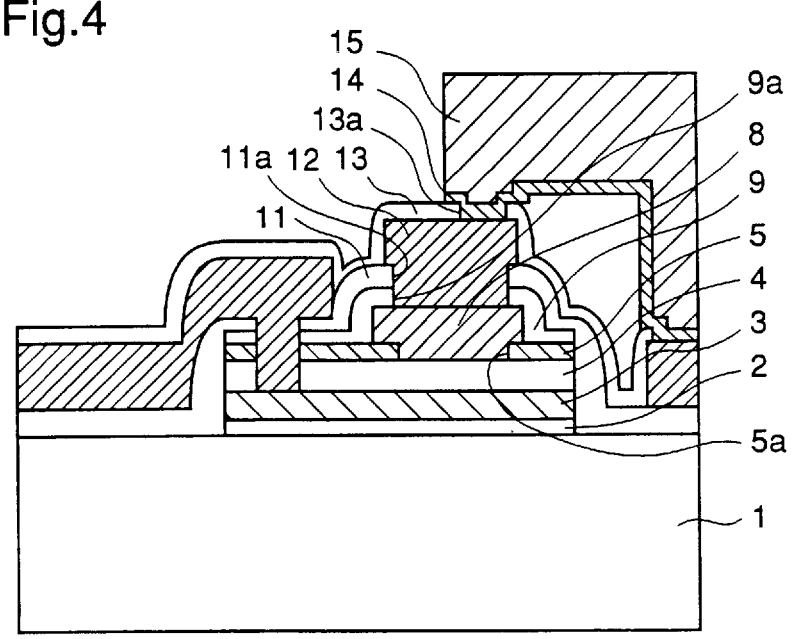
FIG. 4 is a cross-sectional view illustrating a semiconductor device according to a second embodiment of the invention.

FIG. 4 is a cross-sectional view illustrating a semiconductor device according to a second embodiment of the present invention. In FIG. 4, reference numeral 1 designates a compound semiconductor substrate. In this second embodiment, a GaAs substrate is employed. An insulating film 2 is disposed on the substrate 1 to insulate the substrate 1 from elements disposed on the substrate. Preferably, a 750 Å thick SiO film is employed. Alternatively, a 500~1000 Å thick SiON or SiN film produced by plasma CVD may be employed.

The elements disposed on the substrate 1 are as follows. A lower electrode 3 is disposed on the insulating film 2. The lower electrode 3 comprises laminated layers of Ti/Mo/Au having a total thickness of 3000 Å and a low sheet resistance. The order of the laminated layers may be changed to Ti/Au/Mo. Alternatively, the lower electrode 3 may comprise laminated metal layers of Ti/Pt, several thousands of angstroms thick, having a high heat resistance. A dielectric film 4 (first insulating film) is disposed on the lower electrode 3 and on the insulating film 2. In this second embodiment, a 2000 Å thick SiN film having an Si to N composition ratio of 3/4, i.e., $Si_3N_4$, is employed. Alternatively, the dielectric film 4 may comprise a 1000~2000 Å thick SiON or SiN film produced by plasma CVD.

A second insulating film 5 is disposed on the dielectric film 4. In this embodiment, a 500 Å thick SiN film that contains more hydrogen than the dielectric film 4 and has an etching rate by buffered HF higher than that of the dielectric film 4 is employed. The SiN film is produced by plasma CVD. Alternatively, an SiO film produced by plasma CVD may be employed. The second insulating film 5 has an opening 5a in which a portion of the dielectric film 4, opposed to the lower electrode 3, is exposed.

An upper electrode 8 is disposed on the surface of the dielectric film 4 through the opening 5a of the second insulating film 5, and the peripheral portion of the upper electrode 8 extends on the second insulating film 5. The upper electrode 8 comprises a 2000 Å thick Au film.

An insulating film 9 is disposed surrounding the upper electrode 8. In this embodiment, a 1000 Å thick SiO film is employed as the insulating film 9, whereby the parasitic capacitance is reduced. Alternatively, an SiN film about 5000 Å thick may be employed. In this case, the moisture resistance is increased. The insulating film 9 has an opening 9a to expose a portion of the surface of the upper electrode 8.

When the semiconductor device is viewed in the direction perpendicular to the substrate 1, perimeter of the SiO film 2, the lower electrode 3, the dielectric film 4, the second insulating film 5, and the SiO film 9 have similar outlines.

An insulating film 11 covers the SiO film 2, the lower electrode 3, the dielectric film 4, the second insulating film 5, and the SiO film 9. The insulating film 11 has an opening 11a as large as the opening 9a of the SiO film 9. These openings 9a and 11a provide a contact hole. In this second embodiment, a 1000 Å thick SiO film is employed as the insulating film 11, whereby the parasitic capacitance is reduced. Alternatively, an SiN film about 5000 Å thick may be employed. In this case, the moisture resistance is increased.

A wiring layer 12 is disposed on the upper electrode 8, electrically contacting the upper electrode 8. In this second embodiment, a 1.5 μm thick Au film is employed. It is desired that the wiring layer 12 is as thick as 1~2 μm to avoid conductor loss. An insulating film 13 covers the entire surface and has an opening 13a on the wiring layer 12. In this second embodiment, a 1000 Å thick SiO film is employed, whereby the parasitic capacitance is reduced. Alternatively, an SiN film about 5000 Å thick may be employed. In this case, the moisture resistance is increased.

The above-mentioned insulating films 2, 9, 11, and 13 protect the capacitor in the semiconductor device and other active elements (not shown) in the GaAs MMIC from ashing or etching in the fabrication process.

A feeding layer 14 electrically contacts the wiring layer 12 through the opening 13a of the insulating film 13. An air-bridge is disposed on the feeding layer 14.

FIGS. 5(a)–5(g) are cross-sectional views illustrating process steps in a method for fabricating the semiconductor device shown in FIG. 4.

Initially, as illustrated in FIG. 5(a), the insulating film 2 is deposited on the compound semiconductor substrate 1. Preferably, a 500~1000 Å thick SiO, SiON, or SiN film is deposited by plasma CVD. In this second embodiment, a 750 Å thick SiO film is employed.

Thereafter, a metal film 3a, which is later patterned to form the lower electrode 3, is applied to the surface of the SiO film 2. Preferably, a Ti/Pt film having a high heat resistance or a Ti/Mo/Au (Ti/Au/Mo) film having a low sheet resistance is applied to a thickness of several thousands of angstroms. In this second embodiment, a 3000 Å thick Ti/Mo/Au film is employed.

Further, the dielectric film 4 is deposited on the metal film 3a by plasma CVD. Preferably, a 1000~2000 Å thick SiON or SiN film is deposited. In this embodiment, a 2000 Å thick SiN film is deposited while controlling the flow rate of $SiH_4$ and the flow rate of $NH_3$ so that the composition ratio of Si/N is 3/4.

Subsequently, the second insulating film 5 is deposited on the dielectric film 4 by plasma CVD. In this second embodiment, a 100 Å thick SiN film containing more hydrogen than the dielectric film 4 and having a relatively high etching rate by buffered HF is employed.

To be specific, this SiN film 5 is produced by changing the CVD conditions in comparison with the CVD conditions for the $Si_3N_4$ dielectric film 4. That is, the CVD temperature is reduced, the gas pressure is increased, and the RF power is reduced. More specifically, the CVD temperature is reduced from 300° C. to 250° C., the gas pressure is increased from 0.5 Torr to 2.0 Torr, and the RF power is reduced from 200 W to 100 W. Thereby, the etching rate of the SiN film 5 by buffered HF is increased from 80 Å/min to 1000 Å/min. Further, the SiN film 5 produced under the these conditions contains more hydrogen than the $Si_3N_4$ dielectric film 4. The buffered HF is $HF/NH_4F$ (=1/30).

Thereafter, using the buffered HF, a portion of the second insulating film 5 is etched selectively with respect to the dielectric film 4, producing the opening 5a in the second insulating film 5. Since the ratio of the etching rate of the second insulating film 5 to the etching rate of the dielectric film 4 is about 12:1, selective etching of the second insulating film 5 is possible.

In the step of FIG. 5(b), a resist 10 is applied over the entire surface and patterned by a conventional photolithographic technique to produce an opening 10a that is larger than the opening 5a and surrounds the opening 5a. Then, using the resist pattern 10 as a mask, a metal film 8a, for example, a 2000 Å thick Au film, is deposited by vacuum evaporation. Thereafter, the resist pattern 10 and unnecessary portions of the metal film 8a on the resist pattern 10 are removed by the lift-off technique, resulting in the upper electrode 8, the peripheral portion of which extends onto the second insulating film 5. The upper electrode 8 may be produced by the wire sputtering and ion milling method.

In this second embodiment of the invention, since the upper electrode 8 and the wiring layer 12 are produced separately, when Au is employed as the materials of the electrode 8 and the wiring layer 12, the thickness of the upper electrode 8 can be reduced to about 2000 Å though the wiring layer 12 must be as thick as 1~2 μm to assure conductor continuity. Hence, even when the upper electrode 8 is produced by the wire sputtering and ion milling method, the thickness of the etched portion of the second insulating film 5 in the vicinity of the upper electrode 8 is only several tens of angstroms. Therefore, in this second embodiment, the thickness of the second insulating film 5 is 100 Å, leaving a margin.

In the step of FIG. 5(c), the upper electrode 8 and its vicinity are covered with the insulating film 9. Thereafter, using a planar resist mask 16 which masks the upper electrode 8 and the vicinity when viewed in the direction perpendicular to the substrate 1, the insulating film 2, the dielectric film 4, the second insulating film 5, and the insulating film 9 are patterned by RIE (Reactive Ion Etching) and the metal film 3a is patterned by ion milling. As a result of the ion milling, the lower electrode 3 is produced.

Thereafter, as shown in FIG. 5(d), the resist 10 is removed by $O_2$ ashing. Further, as illustrated in FIG. 5(e), an insulating film 11 for passivation is formed over the entire surface of the substrate.

In the step of FIG. 5(f), two contact holes are produced to expose the upper electrode 8 and the lower electrode 3, respectively. Since the depth of the contact hole to the lower electrode 3 is different from the depth of the contact hole on the upper electrode 8, dry etching using a fluorine-based gas, such as $CF_4$ or $SF_6$, is employed so that the size of the contact hole, which is produced by etching the thin insulating films 9 and 11 on the upper electrode 8, does not increase. After the production of the contact holes, the wiring layer 12 is produced by the vacuum evaporation and lift-off method, electrically contacting the upper electrode 8. In order to reduce conductor loss, the wiring layer 12 is desired to be as thick as 1~2 μm. In this second embodiment, a 1.5 μm thick Au film is employed.

In the step of FIG. 5(g), an insulating film 13 for passivation is produced over the entire surface of the substrate. Thereafter, a contact hole 13a is produced in the insulating film 13 to expose a portion of the surface of the wiring layer 12, and the feeding layer 14 is produced, electrically contacting the wiring layer 12 through the contact hole 13a. To complete the semiconductor device shown in FIG. 4, the air-bridge 15 is produced on the feeding layer 14.

In the semiconductor device so produced, since the etching rate of the second insulating film 5 is higher than the etching rate of the dielectric film 4, the thickness of the dielectric film 4 after the etching to produce the opening 5a can be uniform between products, so that variations in capacitances between the products can be reduced.

Further, when the upper electrode 8 is produced on the dielectric film 4 through the opening 5a of the second insulating film 5, since the peripheral portion of the upper electrode 8 extends on the second insulating film 5, the dielectric film 4 in the vicinity of the upper electrode 8 is not etched, whereby a reduction in the lifetime of the device is avoided.

Further, although the composition ratio of the SiN dielectric film 4 is different from that of the SiN insulating film 5, since both the films 4 and 5 comprise SiN, these films can be produced in the same apparatus using the same gases and only changing the growth conditions. Therefore, the semiconductor device is produced economically, with high efficiency.

Furthermore, since the upper electrode 8 and the wiring layer 12 are produced separately, when Au is employed, the thickness of the upper electrode 8 can be reduced to about 2000 Å though the wiring layer 12 must be as thick as 1~2 $\mu$m to assure conductor continuity. Therefore, the thickness of the etched portion of the second insulating film 5 in the vicinity of the upper electrode 8 is reduced to several tens of angstroms, so that the thickness of the second insulating film 5 can be reduced. The reduction in the thickness of the second insulating film 5 facilitates the production of the opening 5a and reduces the time required for producing the opening 5a. As a result, the semiconductor device is fabricated with high efficiency.

In this second embodiment of the invention, the lifetime of the device is increased because the peripheral portion of the upper electrode 8 is placed not on the dielectric film 4 but on the insulating film 5. However, the same effects as mentioned above are attained by an alternative process described as follows. That is, the second insulating film 5 having an opening 5a is formed on the lower electrode 3, the dielectric film 4 is formed on the second insulating film 5, and the upper electrode 8 is formed on the dielectric film 4 so that the peripheral portion is placed on the dielectric film 4, as shown in FIG. 3.

[Embodiment 3]

Figure 6:
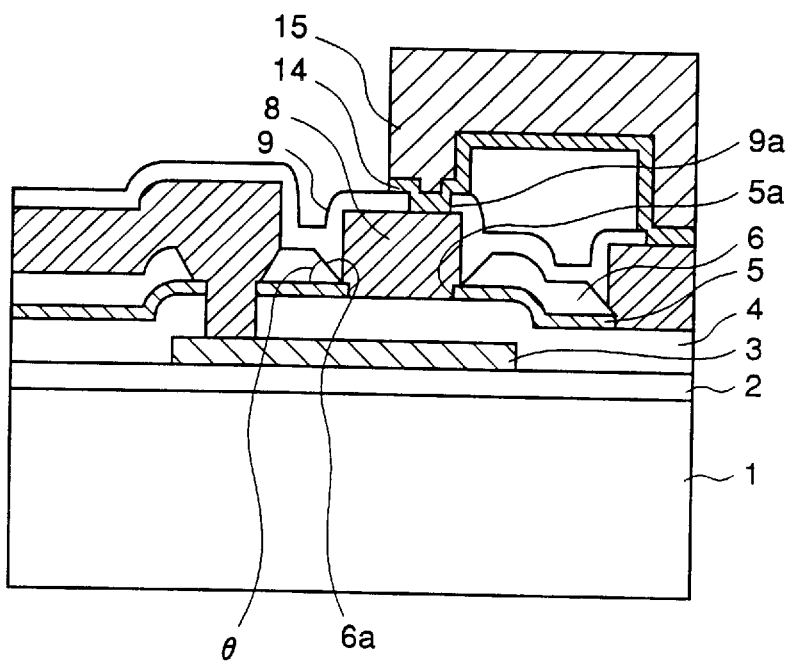
FIG. 6 is a cross-sectional view illustrating a semiconductor device according to a third embodiment of the invention.

FIG. 6 is a cross-sectional view illustrating a semiconductor device according to a third embodiment of the present invention. In FIG. 6, reference numeral 1 designates a compound semiconductor substrate. In this third embodiment, a GaAs substrate is employed. An insulating film 2 is disposed on the substrate 1 to insulate the substrate 1 from elements disposed on the substrate. In this embodiment, a 750 Å thick SiO film is employed. Alternatively, a 500~1000 Å thick SiON or SiN film produced by plasma CVD may be employed.

The elements disposed on the substrate 1 are as follows. A lower electrode 3 is disposed on the insulating film 2. The lower electrode 3 comprises laminated layers of Ti/Mo/Au having a total thickness of 3000 Å and a low sheet resistance. The order of the laminated layers may be changed to Ti/Au/Mo. Alternatively, the lower electrode 3 may comprise laminated metal layers of Ti/Pt, several thousands of angstroms thick, having a high heat resistance. A dielectric film 4 (first insulating film) is disposed on the lower electrode 3 and on the insulating film 2. In this embodiment, a 2000 Å thick SiN film having an Si to N composition ratio of 3/4, that is, $Si_3N_4$, is employed. Alternatively, the dielectric film 4 may comprise a 1000~2000 Å thick SiON or SiN film produced by plasma CVD.

A second insulating film 5 is disposed on the dielectric film 4. In this embodiment, a 500 Å thick SiN film produced by plasma CVD and having an Si-rich composition (Si/N= 1.2) is employed. The composition ratio Si/N may be varied within a range from 1 to 1.4. Alternatively, an SiO film produced by plasma CVD may be employed. The second insulating film 5 has an opening 5a to expose a portion of the dielectric film 4 opposed to the lower electrode 3.

A third insulating film 6 is disposed on the second insulating film 5. In this embodiment, a 4000 Å thick SiO film produced by plasma CVD is employed. Alternatively, an SiN film produced by plasma CVD may be employed. The third insulating film 6 has an opening 6a, the perimeter of which surrounds the perimeter of the opening 5a of the second insulating film 5. The side surface of the insulating film 6 in the opening 6a forms an angle $\theta$ less than 90° with the surface of the substrate 1.

An upper electrode 8 is disposed on the surface of the dielectric film 4 through the opening 5a of the second insulating film 5, and the peripheral portion of the upper electrode 8 extends onto the second insulating film 5 or the third insulating film 6. In this third embodiment, the upper electrode 8 comprises a 2 $\mu$m thick Au film. Since the upper electrode 8 also serves as a wiring layer, when Au is employed, the upper electrode 8 must be as thick as 1~2 $\mu$m to assure conductor continuity.

An insulating film 9 is disposed on the upper electrode 8 and on the third insulating film 6. In this embodiment, a 1000 Å thick SiO film is employed, whereby the parasitic capacitance is reduced. Alternatively, an SiN film about 5000 Å thick may be employed. In this case, the moisture resistance is improved. Both of the insulating films 2 and 9 protect the capacitor in the semiconductor device and other active elements (not shown) in the GaAs MMIC from ashing and etching in the fabrication process. The insulating film 9 has an opening 9a to expose a portion of the surface of the upper electrode 8. A feeding layer 14 electrically contacts the upper electrode 8 through the opening 9a. An air-bridge 15 is disposed on the feeding layer 14.

FIGS. 7(a)–7(j) are cross-sectional views illustrating process steps in a method for fabricating the semiconductor device shown in FIG. 6.

Initially, as illustrated in FIG. 7(a), an insulating film 2 is formed on the compound semiconductor substrate 1. Preferably, a 500~1000 Å thick SiO, SiON, or SiN film is deposited by plasma CVD. In this third embodiment, a 750 Å thick SiO film is employed.

In the step of FIG. 7(b), a resist 7 is applied to the surface of the insulating film 2 and patterned by a conventional photolithographic technique to produce an opening in a desired region on the insulating film 2. Using this resist 7 as a mask, a metal film 3a is deposited over the entire surface by vacuum evaporation. Preferably, a Ti/Pt film having a high heat resistance or a Ti/Mo/Au (Ti/Au/Mo) film having a low sheet resistance, several thousands of angstroms thick, is deposited. In this embodiment, a 3000 Å thick Ti/Mo/Au is deposited. Thereafter, the resist mask 7 and unnecessary portions of the metal film 3a on the resist mask 7 are removed by the lift-off technique, leaving the lower electrode 3 on the insulating film 2. Although the lower electrode 3 is produced by the vacuum evaporation and lift-off method, it may be produced by wire sputtering.

In the step of FIG. 7(d), the dielectric film 4 is deposited on the lower electrode 3 by plasma CVD. Preferably, an SiON or SiN film 1000~2000 Å thick is deposited. In this embodiment, a 2000 Å thick SiN film is deposited while controlling the flow rate of $SiH_4$ and the flow rate of $NH_3$ so that the composition ratio of Si/N is 3/4.

The reason for setting the composition of the dielectric film 4 as described above is because it is necessary to reduce the defect density within the dielectric film 4, for high reliability of the capacitor, by approximating the composition ratio of the SiN film 4 to the composition ratio of a constant ratio compound, as described by T. Oku et al. in Materials Research Society Symposium Proceedings, Vol.209 (1991), p.487.

In the step of FIG. 7(e), the second insulating film 5 is deposited on the dielectric film 4 by plasma CVD. More specifically, a 500 Å thick SiN film having a composition ratio of 1.2 (Si/N) is produced by plasma CVD while controlling the flow rate of $SiH_4$ and the flow rate of $NH_3$ so that $NH_3/SiH_4$ becomes 5. The composition ratio Si/N may be varied within a range from 1 to 1.4.

Further, the third insulating film 6 is produced on the second insulating film 5. In this embodiment, a 4000 Å thick SiO film is deposited by plasma CVD. The etching selectivity of the insulating film 6 with respect to the insulating film 5 by buffered HF ($HF/NH_4F=1/30$) is 20 or more. The etching rates of the Si-rich SiN film 5 (Si/N=1.2) and the SiO film 6 by buffered HF are 40 Å/min and 1000 Å/min, respectively.

In the step of FIG. 7(f), a contact hole is formed to expose the surface of the lower electrode 3. Thereafter, as illustrated in FIG. 7(g), a resist is applied to the third insulating film 6 and patterned by a conventional photolithographic technique, producing a resist mask 10 having an opening 10a in which the surface of the third insulating film 6 is exposed.

In the step of FIG. 7(h), using the resist mask 10, the third insulating film 6 is etched by the buffered HF selectively with respect to the second insulating film 5, producing an opening 6a in the third insulating film 6. Since the second insulating film 5 is an Si-rich SiN film and the third insulating film 6 is an SiO film, the selectivity of the third insulating film 6 with respect to the second insulating film is as high as 20, so that the selective etching is possible. In the etching process, the third insulating film 6 is subjected to considerable side etching, so that the angle θ between the side surface of the insulating film 6 in the opening 6a and the surface of the substrate 1 is less than 90°.

After the selective etching of the third insulating film 6, using the resist mask 10, the second insulating film 5 is etched without etching the dielectric film 4, producing an opening 5a. Preferably, the opening 5a is produced by RIE superior in vertical etching to other etching techniques, or ECR (Electron Cyclotron Resonance) etching.

In the step of FIG. 7(i), a metal film 8a, for example, a 2 μm thick Au film, is deposited on the entire surface by vacuum evaporation, and the resist mask 10 and unnecessary portions of the metal film 8a are removed by the lift-off technique, resulting in an upper electrode 8 contacting the dielectric film 4, the peripheral portion of which extends on the second insulating film. Since the third insulating film 6 is side-etched and the edge of the opening 5a is exposed in the step of FIG. 7(h), when the metal film 8a is deposited by vacuum evaporation, it covers the edge of the opening 5a. The edge of the opening 5a on the surface of the second insulating film 5 is spaced about 0.2 μm from the edge of the upper electrode 8.

In the step of FIG. 7(j), a 1000 Å thick SiO film 9 is deposited over the entire surface, and a contact hole 9a is produced in the SiO film 9 to expose the surface of the upper electrode 8. Then, a feeding layer 14 is produced, electrically contacting the upper electrode 8 through the contact hole 9a. To complete the semiconductor device shown in FIG. 6, an air-bridge 15 is produced on the feeding layer 14.

In the semiconductor device so produced, since the self-alignment technique is employed, that is, the etching of the third insulating film 3, the removal of the second insulating film 5, and the formation of the upper electrode 8 are performed with the same mask 16, the number of process steps can be reduced. In addition, the integration density of the semiconductor device is increased.

Further, when the upper electrode 8 is produced on the dielectric film 4 through the opening 5a of the second insulating film 5, since the peripheral portion of the upper electrode 8 extends onto the second insulating film 5, the dielectric film 4 in the vicinity of the upper electrode 8 is not etched, whereby an unwanted reduction in the lifetime of the device is avoided.

Further, although the composition ratio of SiN of the dielectric film 4 is different from that of the insulating film 5, since both of the films 4 and 5 comprise SiN, these films can be produced in the same apparatus using the same gases and changing the growth conditions. Therefore, the semiconductor device is produced economically, with high efficiency.

In this third embodiment of the invention, the lifetime of the device is increased by extending the upper electrode 8 from the dielectric film 4 through the opening 5a onto the insulating film 5. However, the same effects as mentioned above are attained by an alternative process described as follows. That is, the second insulating film 5 having an opening 5a is formed on the lower electrode 3, the dielectric film 4 is formed on the second insulating film 5, and the upper electrode 8 is formed on the dielectric film 4 so that the peripheral portion is placed on the dielectric film 4, as shown in FIG. 3.

[Embodiment 4]

Figure 8:
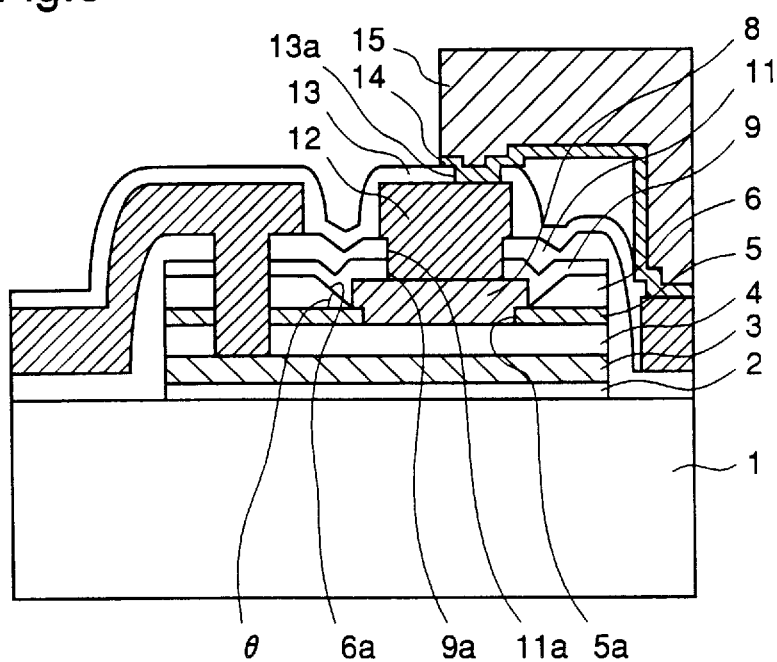
FIG. 8 is a cross-sectional view illustrating a semiconductor device according to a fourth embodiment of the invention.

FIG. 8 is a cross-sectional view illustrating a semiconductor device according to a fourth embodiment of the present invention. In FIG. 8, reference numeral 1 designates a compound semiconductor substrate. In this fourth embodiment, a GaAs substrate is employed. An insulating film 2 is disposed on the substrate 1 to insulate the substrate 1 from elements disposed on the substrate. In this embodiment, a 750 Å thick SiO film is employed. Alternatively, a 500~1000 Å thick SiON or SiN film produced by plasma CVD may be employed.

The elements disposed on the substrate 1 are as follows. A lower electrode 3 is disposed on the insulating film 2. The lower electrode 3 comprises laminated layers of Ti/Mo/Au having a thickness of 3000 Å and a low sheet resistance. The order of the laminated layers may be changed to Ti/Au/Mo. Alternatively, the lower electrode 3 may comprise laminated metal layers of Ti/Pt, several thousands of angstroms thick, having a high heat resistance. A dielectric film 4 (first insulating film) is disposed on the lower electrode 3 and on the insulating film 2. In this embodiment, a 2000 Å thick SiN film having an Si to N composition ratio of 3/4, that is, $Si_3N_4$, is employed. Alternatively, the dielectric film 4 may comprise a 1000~2000 Å thick SiON or SiN film produced by plasma CVD.

A second insulating film 5 is disposed on the dielectric film 4. In this embodiment, a 500 Å thick SiN film produced by plasma CVD and having an Si-rich composition ratio (Si/N=1.2) is employed. The composition ratio Si/N may be varied within a range from 1 to 1.4. Alternatively, an SiO film produced by plasma CVD may be employed. The second insulating film 5 has an opening 5a to expose a portion of the dielectric film 4 opposed to the lower electrode 3.

A third insulating film 6 is disposed on the second insulating film 5. In this embodiment, a 4000 Å thick SiO film produced by plasma CVD is employed. Alternatively, an SiN film produced by plasma CVD may be employed. The third insulating film 6 has an opening 6a, the perimeter of which surrounds the perimeter of the opening 5a of the second insulating film 5. The side surface of the insulating film 6 in the opening 6a forms an angle θ less than 90° with the surface of the substrate 1.

An upper electrode 8 is disposed on the surface of the dielectric film 4 through the opening 5a of the second insulating film 5, and the peripheral portion of the upper electrode 8 extends onto the second insulating film 5. The upper electrode 8 comprises a 2000 Å thick Au film.

An insulating film 9 is disposed surrounding the upper electrode 8. In this fourth embodiment, a 1000 Å thick SiO film is employed as the insulating film 9, whereby the parasitic capacitance is reduced. Alternatively, an SiN film about 5000 Å thick may be employed. In this case, the moisture resistance is increased. The insulating film 9 has an opening 9a to expose a portion of the upper electrode 8.

When the semiconductor device is viewed in the direction perpendicular to the substrate 1, the perimeters of the SiO film 2, the lower electrode 3, the dielectric film 4, the second insulating film 5, the third insulating film 6, and the SiO film 9 have similar outlines.

An insulating film 11 covers the SiO film 2, the lower electrode 3, the dielectric film 4, the second insulating film 5, the third insulting film 6, and the SiO film 9. In this embodiment, a 1000 Å thick SiO film is employed as the insulating film 11, whereby the parasitic capacitance is reduced. Alternatively, an SiN film about 5000 Å thick may be employed. In this case, the moisture resistance is increased. The insulating film 11 has an opening 11a as large as the opening 9a of the SiO film 9. These openings 9a and 11a provide a contact hole.

A wiring layer 12 is disposed on the upper electrode 8, electrically contacting the upper electrode 8. In this embodiment, a 1.5 μm thick Au film is employed. It is desired that the wiring layer 12 is as thick as 1~2 μm to assure conductor continuity. An insulating film 13 covers the entire surface and has an opening 13a on the wiring layer 12. In this embodiment, a 1000 Å thick SiO film is employed, whereby the parasitic capacitance is reduced. Alternatively, an SiN film about 5000 Å thick may be employed. In this case, the moisture resistance is increased.

The insulating films 2, 9, 11, and 13 protect the capacitor in the semiconductor device and other active elements (not shown) in the GaAs MMIC from ashing or etching in the fabrication process.

A feeding layer 14 electrically contacts the wiring layer 12 through the opening 13a of the insulating film 13. An air-bridge is disposed on the feeding layer 14.

FIGS. 9(a)–9(j) are cross-sectional views illustrating process steps in a method for fabricating the semiconductor device shown in FIG. 8.

Initially, as illustrated in FIG. 9(a), the insulating film 2 is deposited on the compound semiconductor substrate 1. Preferably, a 500~1000 Å thick SiO, SiON, or SiN film is deposited by plasma CVD. In this fourth embodiment, a 750 Å thick SiO film is employed.

Thereafter, a metal film 3a is deposited on the surface of the SiO film 2. Preferably, a Ti/Pt film having a high heat resistance or a Ti/Mo/Au (Ti/Au/Mo) film having a low sheet resistance, several thousands of angstroms thick, is deposited. In this embodiment, a 3000 Å thick Ti/Mo/Au film is employed.

Further, the dielectric film 4 is deposited on the metal film 3a by plasma CVD. Preferably, a 1000~2000 Å thick SiON or SiN film is deposited. In this embodiment, a 2000 Å thick SiN film is deposited while controlling the flow rate of $SiH_4$ and the flow rate of $NH_3$ so that the composition ratio Si/N is 3/4.

The reason for setting the composition of the dielectric film 4 as described above is because it is necessary to reduce the defect density within the dielectric film 4, for high reliability of the capacitor, by approximating the composition ratio of the SiN film 4 to the composition ratio of a constant ratio compound, as described by T. Oku et al. in Materials Research Society Symposium Proceedings, Vol.209 (1991), p.487.

Next, the second insulating film 5 is deposited on the dielectric film 4 by plasma CVD. More specifically, a 500 Å thick SiN film having a composition ratio Si/N of 1.2 is deposited by plasma CVD while controlling the flow rate of $SiH_4$ and the flow rate of $NH_3$ so that $NH_3/SiH_4$ is 5. The composition ratio Si/N may be varied within a range from 1 to 1.4.

Further, the third insulating film 6 is deposited on the second insulating film 5. In this embodiment, a 4000 Å thick SiO film is deposited by plasma CVD. The selectivity of the insulating film 6 with respect to the insulating film 5 by buffered HF ($HF/NH_4F=1/30$) is 20 or more. The etching rates of the Si-rich SiN film 5 (Si/N=1.2) and the SiO film 6 by the buffered HF are 40 Å/min and 1000 Å/min, respectively.

In the step of FIG. 9(b), a resist 10 is applied over the entire surface and patterned by a conventional photolithographic technique to produce an opening 10a in which a portion of the third insulating film 6 on the lower electrode 3 is exposed.

In the step of FIG. 9(c), using the resist 10 as a mask, only the third insulating film 6 is selectively etched by the buffered HF without etching the second insulating film 5, producing an opening 6a in the third insulating film 6. Since the second insulating film 5 is an Si-rich SiN film and the third insulating film 6 is an SiO film, the selectivity of the SiO film with respect to the SiN film is about 20, so that the selective etching is possible. In the etching process, the third insulating film 6 is subjected to considerable side etching, so that the angle θ between the side surface of the insulating film 6 in the opening 6a and the surface of the substrate 1 is less than 90°.

After the selective etching of the third insulating film 6, using the resist mask 10, the second insulating film 5 is etched without etching the dielectric film 4, producing an opening 5a. Preferably, the opening 5a is produced by RIE which is superior in vertical etching to other etching techniques, or ECR (Electron Cyclotron Resonance) etching.

In the step of FIG. 9(e), a metal film 8a, for example, a 2 μm thick Au film, is deposited on the entire surface by vacuum evaporation, and the resist mask 10 and unnecessary portions of the metal film 8a are removed by the lift-off technique, resulting in an upper electrode 8 contacting the dielectric film 4, the peripheral portion of which extends on the second insulating film. Since the third insulating film 6 is side-etched and the edge of the opening 5a is exposed in the step of FIG. 7(h), when the metal film 8a is deposited by vacuum evaporation, it covers the edge of the opening 5a. The edge of the opening 5a on the surface of the second insulating film 5 is spaced about 0.2 μm from the edge of the upper electrode 8.

Figure 9:
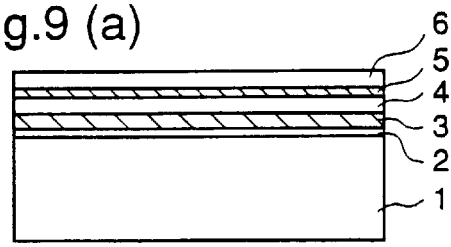
FIGS. 9(a)–9(j) are cross-sectional views illustrating process steps in a method of fabricating a semiconductor device according to the fourth embodiment.
Figure 9:
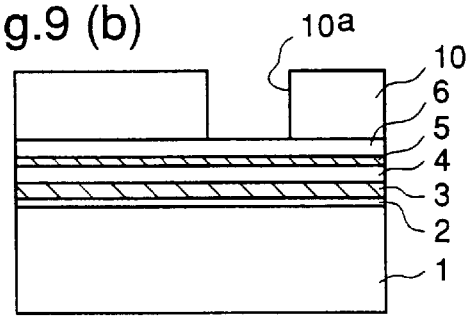
Figure 9:
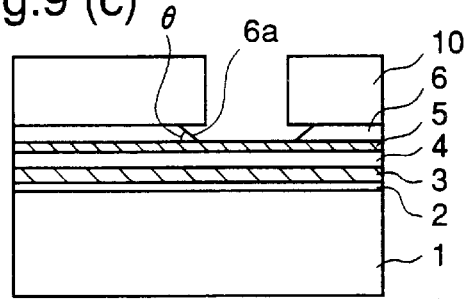
Figure 9:
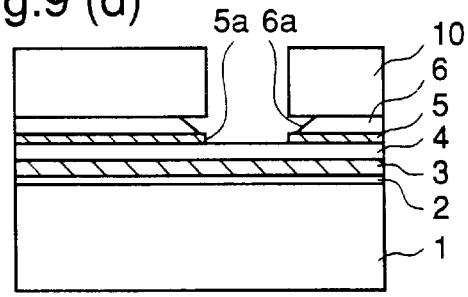
Figure 9:
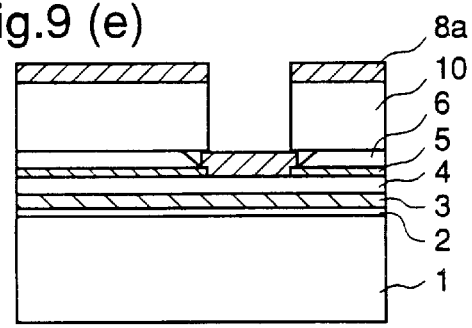
Figure 9:
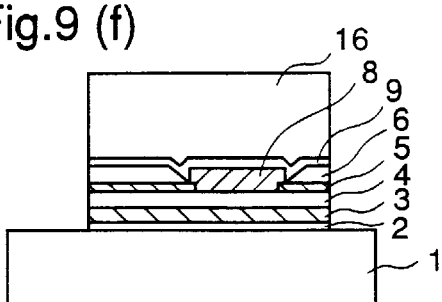
Figure 9:
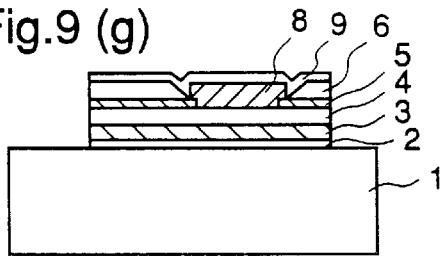
Figure 9:
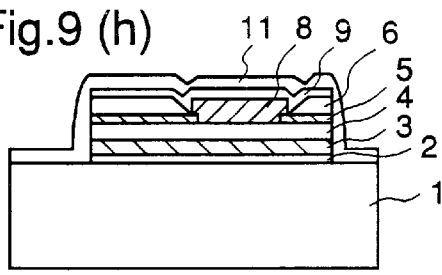
Figure 9:
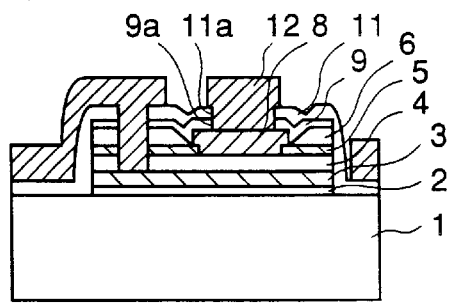
Figure 9:
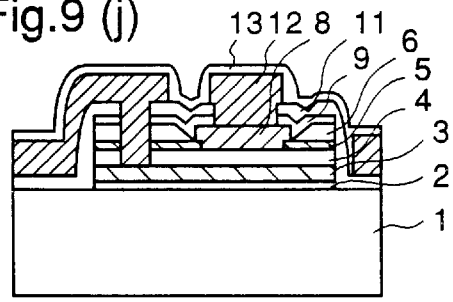
Figure 10:
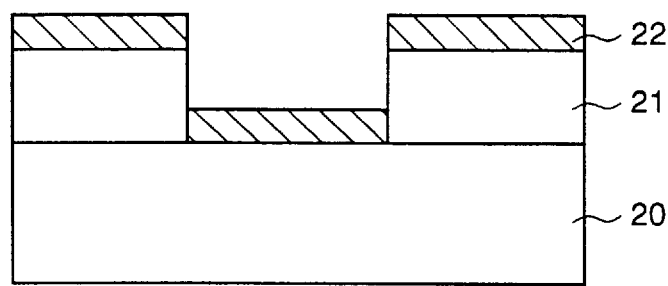
FIG. 10 is a schematic diagram for explaining a method for fabricating an electrode using the vacuum evaporation and lift-off technique.
Figure 11:
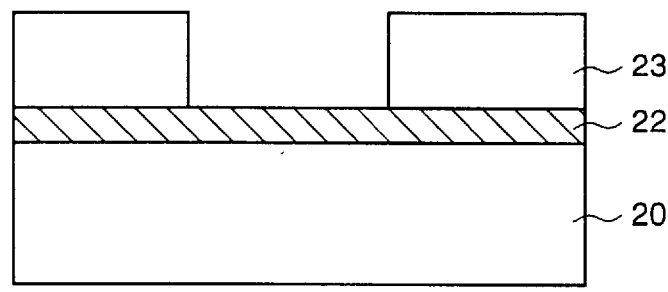
FIG. 11 is a schematic diagram for explaining a method for fabricating an electrode using wire sputtering and ion milling.
Figure 12:
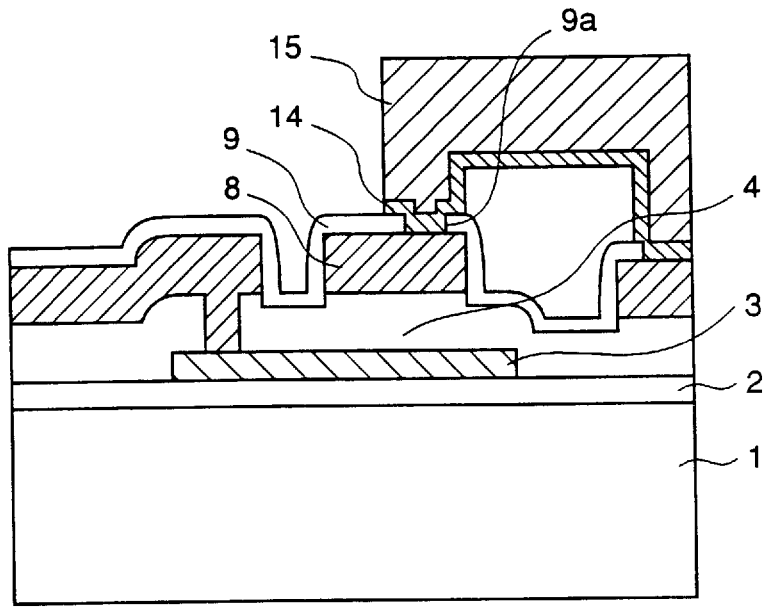
FIG. 12 is a cross-sectional view illustrating an MIM capacitor according to the prior art.

In the step of FIG. 9(*f*), the upper electrode 8 and its vicinity are covered with the insulating film 9. Thereafter, using a planar resist mask 16 which masks the upper electrode 8 and the vicinity when viewed in the direction perpendicular to the substrate 1, the insulating film 2, the dielectric film 4, the second insulating film 5, the third insulating film 6, and the insulating film 9 are patterned by RIE and the metal film 3*a* is patterned by ion milling. As a result of the ion milling, the lower electrode 3 is produced.

Thereafter, as shown in FIG. 9(*g*), the resist 10 is removed by $O_2$ ashing. Further, as illustrated in FIG. 9(*h*), an insulating film 11 for passivation is formed over the entire surface of the substrate.

In the step of FIG. 9(*i*), two contact holes are produced to expose the upper electrode 8 and the lower electrode 3, respectively. Since the depth of the contact hole on the lower electrode 3 is different from the depth of the contact hole on the upper electrode 8, dry etching using a fluorine-based gas, such as $CF_4$ or $SF_6$, is employed so that the size of the contact hole, which is produced by etching the thin insulating films 9 and 11 on the upper electrode 8, does not increase. After the production of the contact holes, the wiring layer 12 is produced by the vacuum evaporation and lift-off technique, electrically contacting the upper electrode 8. In order to assure conductor continuity, the wiring layer 12 is desired to be as thick as 1~2 μm. In this fourth embodiment, a 1.5 μm thick Au film is employed.

In the step of FIG. 9(*j*), an insulating film 13 for passivation is produced over the entire surface of the substrate. Thereafter, a contact hole 13*a* is produced in the insulating film 13 to expose a portion of the wiring layer 12, and the feeding layer 14 is produced, electrically contacting the wiring layer 12 through the contact hole 13*a*. To complete the semiconductor device shown in FIG. 8, the air-bridge 15 is produced on the feeding layer 14.

In the semiconductor device so produced, since the self-alignment technique is used, that is, the etching of the third insulating film 3, the removal of the second insulating film 5, and the formation of the upper electrode 8 are performed with the same mask 16, the number of process steps can be reduced. In addition, the integration density of the semiconductor device is increased.

Further, when the upper electrode 8 is produced on the dielectric film 4 through the opening 5*a* of the second insulating film 5, since the peripheral portion of the upper electrode 8 extends onto the second insulating film 5, the dielectric film 4 in the vicinity of the upper electrode 8 is not etched, whereby a reduction in the lifetime of the device is avoided.

Further, although the composition ratio of SiN of the dielectric film 4 is different from that of the insulating film 5, since both of the films 4 and 5 comprise SiN, these films can be produced in the same apparatus using the same gases but changing the growth conditions. Therefore, the semiconductor device is produced economically, with high efficiency.

Furthermore, since the upper electrode 8 and the wiring layer 12 are produced separately, when Au is employed, the thickness of the upper electrode 8 can be reduced to about 2000 Å though the wiring layer 12 must be as thick as 1~2 μm to assure conductor continuity. Therefore, the thickness of the etched portion of the second insulating film 5 in the vicinity of the upper electrode 8 is reduced to several tens of angstroms, so that the thickness of the second insulating film 5 can be reduced. The reduction in the thickness of the second insulating film 5 facilitates the production of the opening 5*a* and reduces the time required for producing the opening 5*a*. As a result, the semiconductor device is fabricated with high efficiency.

In this fourth embodiment of the invention, the lifetime of the device is increased by extending the upper electrode 8 from the dielectric film 4 through the opening 5*a* onto the insulating film 5. However, the same effects as mentioned above are attained by an alternative process as follows. That is, the second insulating film 5 having an opening 5*a* is formed on the lower electrode 3, the dielectric film 4 is formed on the second insulating film 5, and the upper electrode 8 is formed on the dielectric film 4 so that the peripheral portion is placed on the dielectric film 4, as shown in FIG. 3.

What is claimed is:

1. A capacitor comprising:
   a lower electrode;
   a first insulating film disposed on the lower electrode and comprising a silicon nitride film having an etching rate;
   a second insulating film disposed on the first insulating film and comprising a second silicon nitride film having an etching rate higher than the etching rate of the first insulating film, the second insulating film having an opening exposing a portion of the first insulating film on the lower electrode; and
   an upper electrode disposed on the first insulating film in the opening in the second insulating film and extending on the second insulating film.

2. The capacitor of claim 1 wherein the second insulating film contains more hydrogen than the first insulating film.

3. The capacitor of claim 1 comprising a wiring layer disposed on the upper electrode and electrically contacting the upper electrode.

4. A capacitor comprising:
   a lower electrode;
   a first insulating film disposed on the lower electrode;
   a second insulating film disposed on the first insulating film and having a first opening exposing a portion of the first insulating film on the lower electrode, the first opening having a perimeter;
   a third insulating film disposed on the second insulating film and having a second opening exposing a portion of the second insulating film, the second opening having a second perimeter that surrounds the perimeter of the first opening on the second insulating film; and
   an upper electrode disposed on the first insulating film in the first opening and extending onto the second insulating film.

5. The capacitor of claim 1 wherein said second perimeter of the second opening in the third insulating film is larger than the perimeter of the first opening in the second insulating film.

6. The capacitor of claim 4 wherein the first insulating film is a silicon nitride film having a silicon to nitrogen composition ratio of 3:4, the second insulating film is a second silicon nitride film having a high proportion of silicon than nitrogen, and the third insulating film is a silicon oxide film.

7. The capacitor of claim 4 wherein the etching rate of the third insulating film is higher than the etching rate of the second insulating film.

8. The capacitor of claim 4 comprising a wiring layer disposed on the upper electrode and electrically contacting the upper electrode.

* * * * *

UNITED STATES PATENT AND TRADEMARK OFFICE
CERTIFICATE OF CORRECTION

PATENT NO.    : 5,812,364
DATED         : September 22, 1998
INVENTOR(S)   : Oku et al.

It is certified that error appears in the above-identified patent and that said Letters Patent is hereby corrected as shown below:

Column 18, Line 50, change "1" to --4--.

Signed and Sealed this

Second Day of February, 1999

Attest:

Attesting Officer

*Acting Commissioner of Patents and Trademarks*